United States Patent
Sumita

[11] Patent Number: 5,673,008
[45] Date of Patent: Sep. 30, 1997

[54] VOLTAGE-CONTROLLED OSCILLATOR AND PLL CIRCUIT EXHIBITING HIGH-FREQUENCY BAND OPERATION, LINEAR FREQUENCY CHARACTERISTICS, AND POWER-SOURCE VARIATION IMMUNITY

[75] Inventor: Masaya Sumita, Osaka, Japan

[73] Assignee: Matsushita Electric Industrial Co., Ltd., Osaka, Japan

[21] Appl. No.: 645,635

[22] Filed: May 15, 1996

[30] Foreign Application Priority Data

May 18, 1995 [JP] Japan .................. 7-120053

[51] Int. Cl.⁶ .............. H03B 5/24; H03B 5/04; H03L 1/00; H03L 7/099
[52] U.S. Cl. .............. 331/57; 331/34; 331/175; 331/177 R
[58] Field of Search .............. 331/34, 57, 175, 331/177 R, 1 A; 327/156–159

[56] References Cited

U.S. PATENT DOCUMENTS

| | | | |
|---|---|---|---|
| 5,285,173 | 2/1994 | Reynolds | 331/57 |
| 5,440,277 | 8/1995 | Ewen et al. | 331/57 X |
| 5,469,120 | 11/1995 | Nguyen et al. | 331/57 X |
| 5,525,938 | 6/1996 | Monk et al. | 331/57 |
| 5,559,476 | 9/1996 | Zhang et al. | 331/57 |
| 5,563,554 | 10/1996 | Mizuno | 331/57 |

FOREIGN PATENT DOCUMENTS 61-206308 9/1986 Japan ................ H03K 3/03

*Primary Examiner*—David Mis
*Attorney, Agent, or Firm*—McDermott, Will & Emery

[57] ABSTRACT

A voltage-controlled oscillator comprises a plurality of delay circuits connected in a ring configuration. Each of the delay circuits comprises a current source and a differential pair of inverting circuits each supplied with current from the current source. Each of the differential pair of inverting circuits consists of a P-type MOS transistor and an N-type MOS transistor having a drain connected to the drain of the P-type MOS transistor. When a control voltage equal to or higher than the threshold voltage of each N-type MOS transistor is applied to the gate thereof, the voltage at the drain of each P-type MOS transistor oscillates at a frequency corresponding to the control voltage, since each N-type MOS transistor exhibits a linear current characteristic with respect to the control voltage.

4 Claims, 11 Drawing Sheets

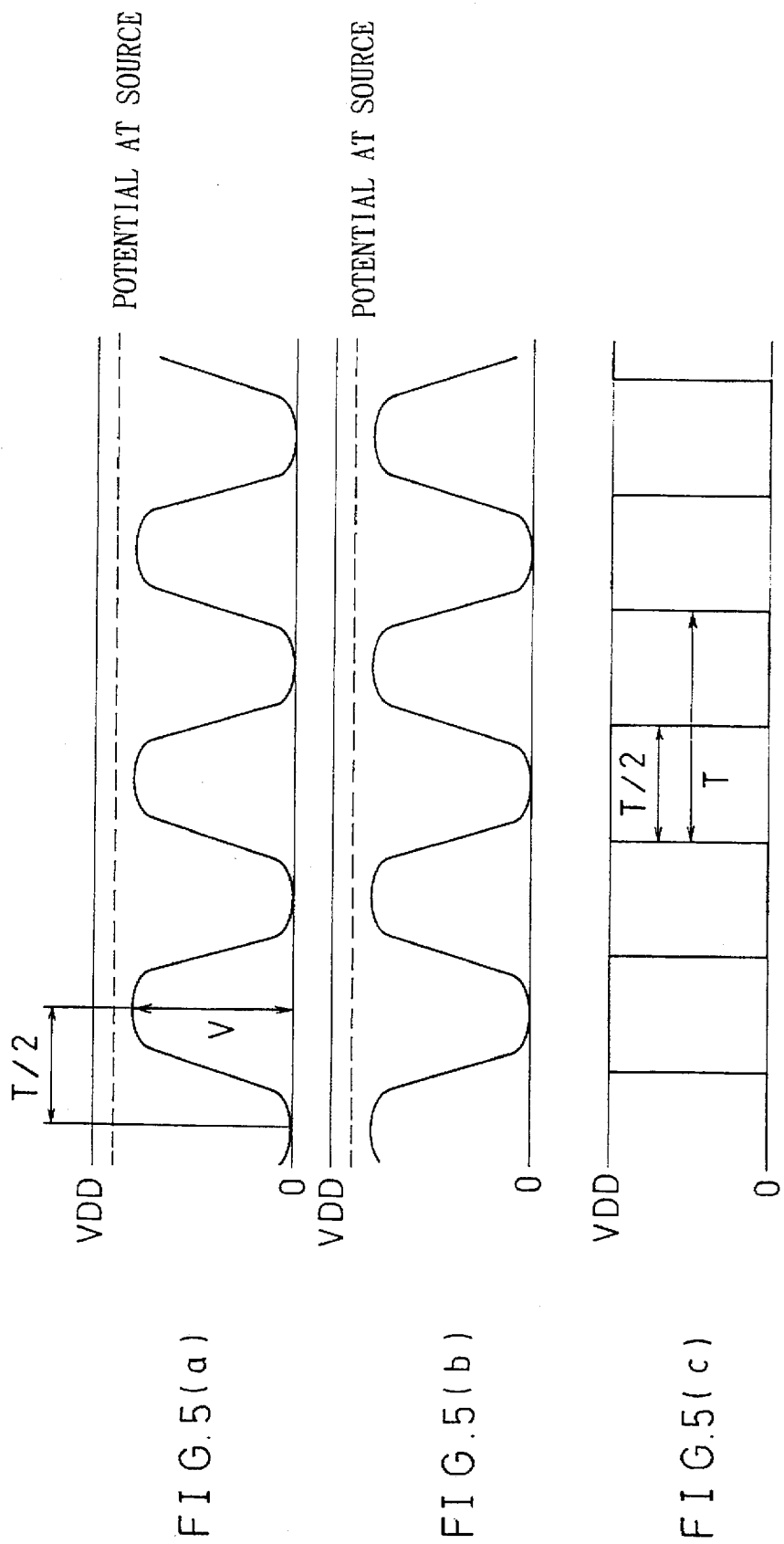

VOLTAGE-CONTROLLED OSCILLATOR AND PLL CIRCUIT EXHIBITING HIGH-FREQUENCY BAND OPERATION, LINEAR FREQUENCY CHARACTERISTICS, AND POWER-SOURCE VARIATION IMMUNITY

BACKGROUND OF THE INVENTION

The present invention relates to a voltage-controlled oscillator wherein the frequency of oscillation varies with a control voltage applied thereto and to a PLL circuit comprising the voltage-controlled oscillator.

A voltage-controlled oscillator for use in a PLL circuit or the like outputs a clock signal oscillating at a frequency varying with a control voltage applied thereto.

Conventionally, a voltage-controlled oscillator composed of bipolar transistors has been used in the high-frequency band of 5 to 10 MHz. However, as higher-speed integrated circuits have been used in recent years, there have been increasing demands for voltage-controlled oscillators operable at higher frequencies.

As examples of the voltage-controlled oscillators that can oscillate at higher frequencies, there have been proposed some each using a ring counter comprising a plurality of inverters composed of CMOS transistors connected in a ring configuration.

For instance, Japanese Laid-Open Patent Publication SHO 61-206308 discloses a voltage-controlled oscillator using a ring counter composed of an odd number of MOS inverters connected in a ring configuration. Each of the MOS inverters consists of two MOSFETs connected in series between two power sources so that a control voltage is applied to the gate of the MOSFET for control connected to one of the power sources.

On the other hand, U.S. Pat. No. 5,285,173 discloses a voltage-controlled oscillator consisting of a plurality of delay circuits connected in a ring configuration, each delay circuit comprising a differential pair of MOS transistors. The delay time in each of the delay circuits is controlled by adjusting the amount of current supplied to each of the delay circuits.

However, the conventional voltage-controlled oscillators present the following problems.

Essential properties required of a voltage-controlled oscillator includes: operability in the high-frequency band; immunity to variations in power-source voltage; and a linear frequency characteristic with respect to a control voltage.

If a jitter or the like occurs in a clock signal outputted from the voltage-controlled oscillator due to variations in power-source voltage, each functional block supplied with the clock signal is adversely affected, which is unfavorable especially in the case where the voltage-controlled oscillator is used in a PLL circuit.

Moreover, since the period of the clock signal becomes extremely short on the order of 10 ns or less in the high-frequency band of 100 MHz or more, a slight difference between the periods may exert a great influence on the operation of each functional block. Therefore, it is necessary to give a sufficient consideration to variations in power-source voltage.

However, no consideration has been given to variations in power-source voltage in the voltage-controlled oscillator disclosed in Japanese Laid-Open Patent Publication SHO 61-206308, though it is operable in the high-frequency band. Accordingly, the delay time in the MOS inverter changes with changes in power-source voltage, resulting in variations in the frequency of oscillation, which renders the voltage-controlled oscillator unsuitable for practical use in a high-frequency circuit.

In the voltage-controlled oscillator disclosed in U.S. Pat. No. 5,285,173, on the other hand, the frequency of oscillation which is controlled by adjusting the amount of current supplied to each of the delay circuits is susceptible to variations in power-source voltage.

SUMMARY OF THE INVENTION

It is therefore an object of the present invention to provide a voltage-controlled oscillator which is operable in the high-frequency band, exhibits a linear frequency characteristic with respect to control voltage, and is immune to variations in power-source voltage.

To solve the above problem, the present invention provides a voltage-controlled oscillator for outputting an oscillating signal at a frequency corresponding to a control voltage applied thereto, comprising a plurality of delay circuits connected in a ring configuration and each providing a delay time varying with the applied control voltage, wherein each of the above delay circuits comprises: a current source; and a differential pair of first and second inverting circuits each supplied with current from the above current source. With the arrangement, either one of the first and second inverting circuits is constantly supplied with the current from the current source, so that the delay time in each of the delay circuits does not change even when the power-source voltage changes, while the frequency of oscillation is not affected by variations in power-source voltage.

In the above voltage-controlled oscillator, the above first inverting circuit preferably comprises: a first FET supplied with the current from the above current source to a source thereof; and a first control element connected to a drain of the above first FET to receive the above control voltage applied thereto, the above first control element exhibiting a linear current characteristic with respect to the applied control voltage and the above second inverting circuit preferably comprises: a second FET supplied with the current from the above current source to a source thereof; and a second control element connected to a drain of the above second FET to receive the above control voltage applied thereto, the above second control element exhibiting a linear current characteristic with respect to the applied control voltage, wherein an input signal to each of the delay circuits is inputted to respective gates of the above first and second FETs and an output signal from each of the delay circuits is outputted from the respective drains of the above first and second FETs.

With the arrangement, the frequency of oscillation is inversely proportioned to the delay time in the delay circuit, while the delay time is inversely proportioned to the values of the currents in the first and second FETs, so that the frequency of oscillation is directly proportioned to the values of the currents in the first and second FETs. Since the first and second control elements connected to the drains of the first and second FETs exhibit linear current characteristics with respect to the control voltage, the frequency of oscillation is directly proportioned to the applied control voltage. Moreover, since each of the first and second FETs receives the current supplied from the current source to the source thereof, the amount of current does not change with a change in power-source voltage, so that the frequency of oscillation does not vary.

Furthermore, in the above voltage-controlled oscillator, the above first inverting circuit preferably further comprises a first latch element connected in parallel to the above first control element, the above first latch element having a small resistance value when source-to-drain current flowing in the above second FET is large and having a large resistance value when the source-to-drain current flowing in the above second FET is small and the above second inverting circuit preferably further comprises a second latch element connected in parallel to the above second control element, the above second latch element having a small resistance value when source-to-drain current flowing in the above first FET is large and having a large resistance value when the source-to-drain current flowing in the above first FET is small.

With the arrangement, if the source-to-drain current of the first FET increases in a given delay circuit, the resistance value of the second latch element connected to the second FET decreases, which permits current to flow. As a result, the source-to-drain current of the first FET starts decreasing since the first and second FETs use the current source in common. Likewise, if the source-to-drain current increases in the second FET, the resistance value of the first latch element connected to the first FET decreases, which permits current to flow. As a result, the source-to-drain current in the second FET starts decreasing. Thus, the provision of the first and second latch elements renders the oscillations of the first and second oscillating circuits more stable.

BRIEF DESCRIPTION OF THE DRAWINGS

FIGS. 5(a) to 5(c) are signal waveform charts in the voltage-controlled oscillator according to the first embodiment of the present invention, of which FIG. 5(a) shows the waveform at the + input of the differential amplifier, FIG. 5(b) shows the waveform at the − input thereof, and FIG. 5(c) shows the waveform of a clock signal outputted therefrom;

FIGS. 6(a) to 6(c) are views diagrammatically showing the operation of each delay circuit in the voltage-controlled oscillator according to the first embodiment of the present invention, of which FIG. 6(a) shows the case where a PMOS is in a conductive state, FIG. 6(b) shows the case where the PMOS is in a non-conductive state; and FIG. 6(c) shows the case where a current source has an internal resistance and the PMOS is in the conductive state;

FIGS. 10(a) to 10(b) are views diagrammatically showing the operation of each delay circuit in the voltage-controlled oscillator according to the second embodiment of the present invention, of which FIG. 10(a) shows the case where a PMOS is in the conductive state and FIG. 10(b) shows the case where the PMOS is in the non-conductive state;

DETAILED DESCRIPTION OF THE INVENTION

Figure 1:
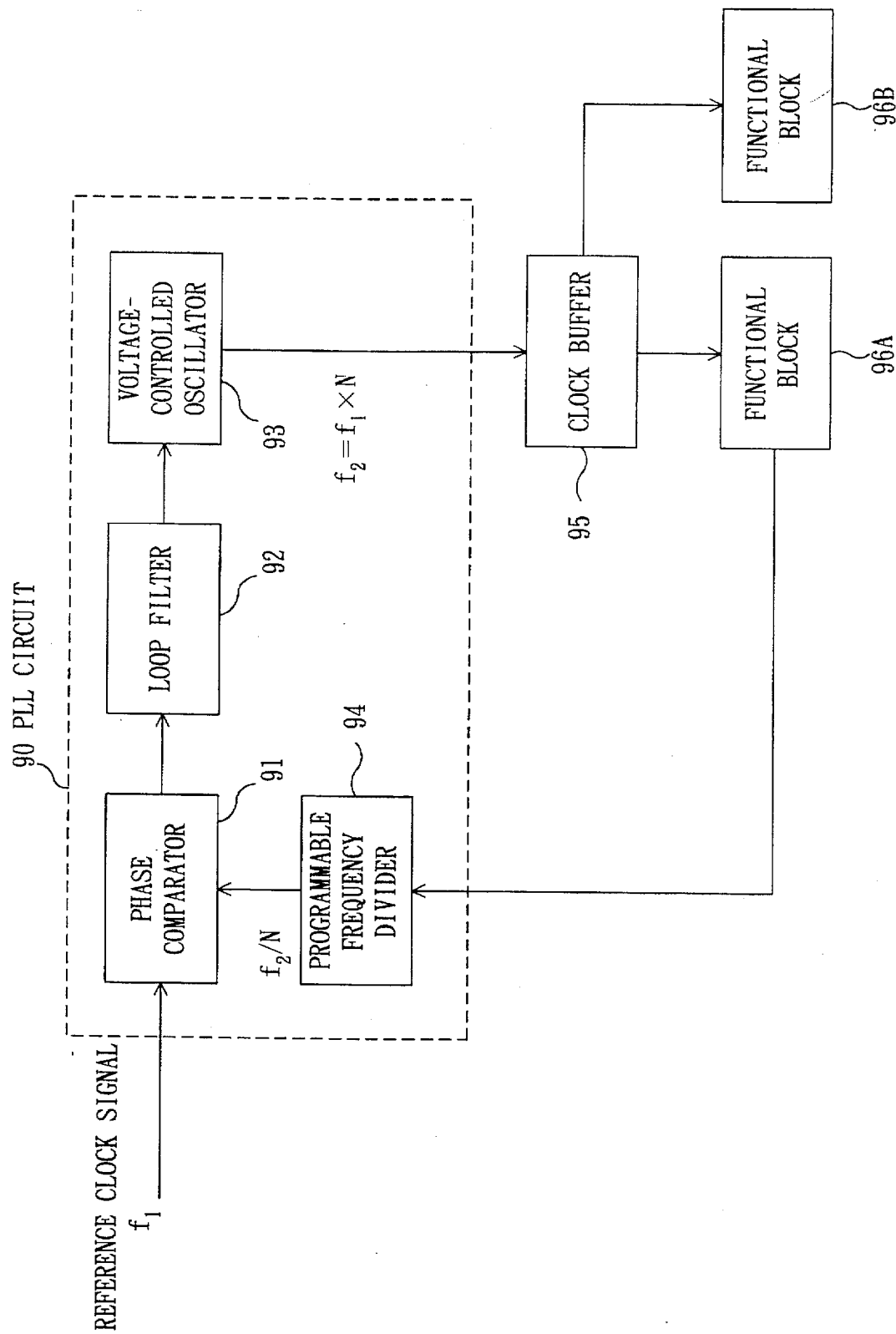
FIG. 1 is a block diagram showing an arrangement of a PLL circuit comprising a voltage-controlled oscillator.

FIG. 1 is a block diagram showing an arrangement of a PLL circuit comprising a voltage-controlled oscillator. In the drawing, the PLL circuit 90 consists of: a phase comparator 91; a loop filter 92; a voltage-controlled oscillator 93; and a programmable frequency divider 94. The phase comparator 91 compares a reference clock signal inputted from the outside with a target clock signal inputted through the programmable frequency divider 94 for phase and frequency and outputs a direct-current signal directly proportional to the obtained phase difference and frequency difference. The loop filter 92 removes a high-frequency component from the inputted signal and outputs a control voltage. The voltage-controlled oscillator 93 outputs a clock signal at a frequency corresponding to the control voltage inputted thereto. It is assumed here that the voltage-controlled oscillator 93 outputs a clock signal at a frequency obtained by multiplying the frequency of the reference clock signal by N.

The clock buffer 95 distributes the clock signal outputted from the voltage-controlled oscillator 93 to functional blocks 96A and 96B. The functional block 96A feeds the inputted clock signal back to the PLL circuit 90. The clock signal fed back has its frequency divided to 1/N in the programmable frequency divider 94. The resulting signal is inputted as the target clock signal to the phase comparator 91.

If there is no phase difference between the reference clock signal and the target clock signal, the output from the phase comparator 91 is 0, while the voltage-controlled oscillator 93 continues to oscillate at the same frequency. If there is any phase difference between the reference clock signal and the target clock signal, the phase comparator 91 outputs a voltage responsive to the phase difference, so that the frequency of oscillation of the voltage-controlled oscillator 93 changes. Hence, the frequency of the clock signal outputted from the voltage-controlled oscillator 93 becomes constant.

(First Embodiment)

Figure 2:
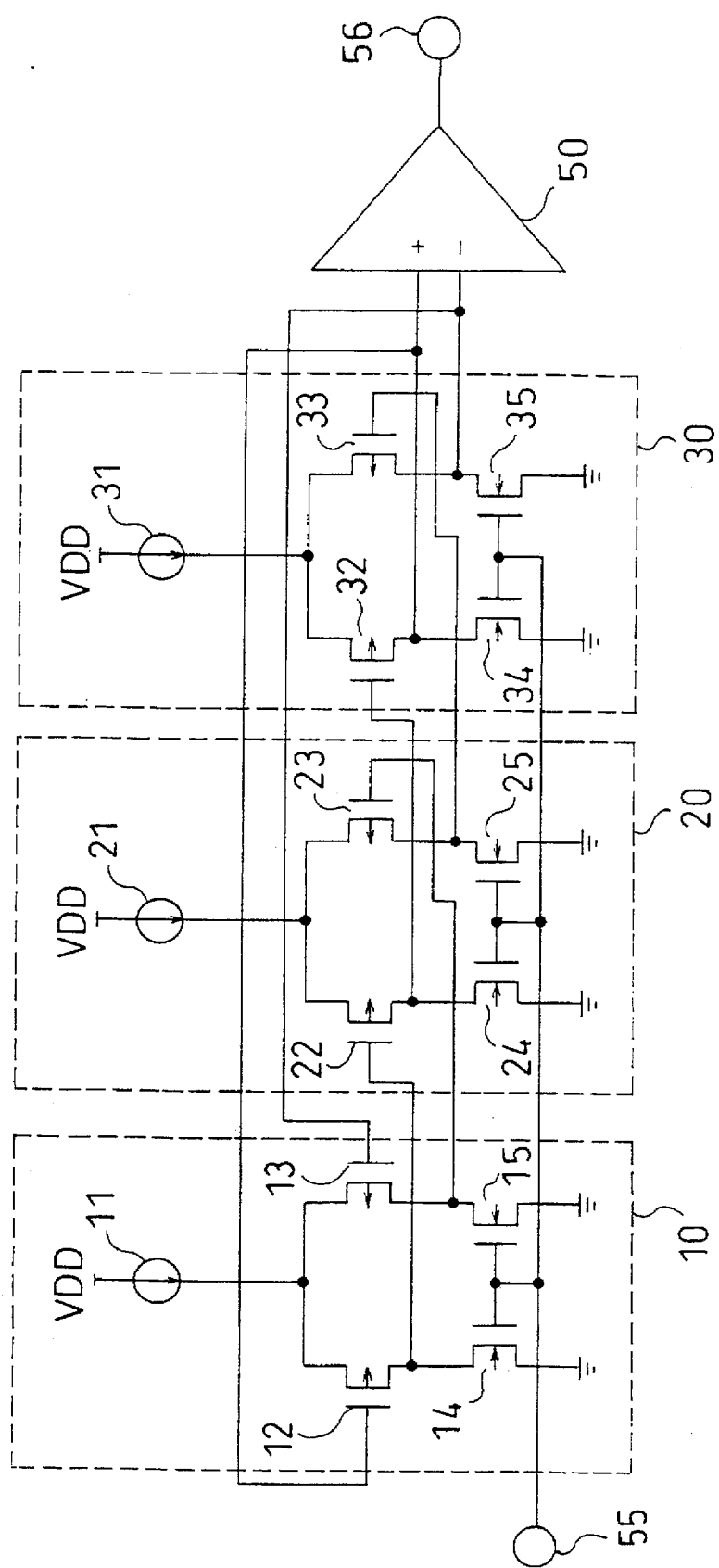
FIG. 2 is a view showing the arrangement of a voltage-controlled oscillator according to a first embodiment of the present invention.

FIG. 2 is a circuit diagram showing an arrangement of a voltage-controlled oscillator according to a first embodiment of the present invention, in which are shown: delay circuits 10, 20, and 30; a differential amplifier 50; a control-voltage input terminal 55; and a clock-signal output terminal 56.

The delay circuit 10 consists of: a current source 11; a P-type MOS transistor (hereinafter referred to as a PMOS)

12 as a first FET; a PMOS 13 as a second FET; an N-type MOS transistor (hereinafter referred to as NMOS) 14 as a first control element; and an NMOS 15 as a second control element. The current source 11 is composed of a PMOS and connected to VDD. The PMOS 12 and PMOS 13 have sources connected to the current source 11. The NMOS 14 has a drain connected to the drain of the PMOS 2 and a source connected to ground. The NMOS 15 has a drain connected to the drain of the PMOS 13 and a source connected to ground. To the gates of the NMOS 14 and NMOS 15 is applied the control voltage inputted from the control-voltage input terminal 51.

The delay circuit 20 consists of: a current source 21; a PMOS 22 as the first FET and a PMOS 23 as the second FET; an NMOS 24 as the first control element and an NMOS 25 as the second control element, similarly to the delay circuit 10. The delay circuit 30 consists of: a current source 31; a PMOS 32 as the first FET and a PMOS 33 as the second FET; an NMOS 34 as the first control element and an NMOS 35 as the second control element.

The voltage at the drain of the PMOS 12 of the delay circuit 10 is applied to the gate of the PMOS 22 of the delay circuit 20. Likewise, the voltage at the drain of the PMOS 22 of the delay circuit 20 is applied to the gate of the PMOS 32 of the delay circuit 30, while the voltage at the drain of the PMOS 32 of the delay circuit 30 is applied to the gate of the PMOS 12 of the delay circuit 10.

On the other hand, the voltage at the drain of the PMOS 13 of the delay circuit 10 is applied to the gate of the PMOS 23 of the delay circuit 20. Likewise, the voltage at the drain of the PMOS 23 of the delay circuit 20 is applied to the gate of the PMOS 33 of the delay circuit 30, while the voltage at the drain of the PMOS 33 of the delay circuit 30 is applied to the gate of the PMOS 13 of the delay circuit 10.

Figure 3:
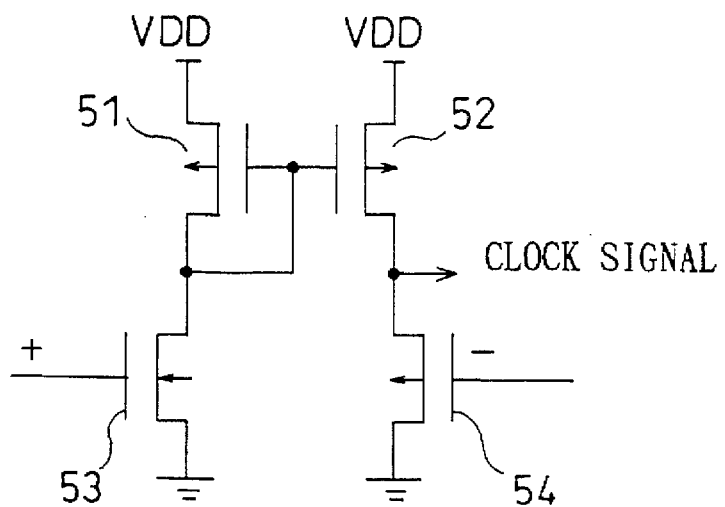
FIG. 3 is a view showing an arrangement of a differential amplifier in the voltage-controlled oscillator according to the first embodiment of the present invention.

The differential amplifier 50 receives the voltages at the drains of the PMOS 32 and PMOS 33 of the delay circuit 30 and outputs a clock signal. FIG. 3 is a circuit diagram showing an arrangement of the differential amplifier 50, in which are shown a PMOS 51, a PMOS 52, a PMOS 54, and an NMOS 53. The voltage at the drain of the PMOS 32 is applied to the gate of the NMOS 53, while the voltage at the drain of the PMOS 33 is applied to the gate of the PMOS 54. From the drain of the PMOS 52, the clock signal is outputted.

A description will be given to the operation of the voltage-controlled oscillator shown in FIG. 2.

If the threshold voltage of each of the NMOS transistors constituting the delay circuits is represented by Vth, the gate voltage of each NMOS transistor becomes Vth or lower when the control voltage is Vth or lower, which brings each NMOS transistor into the non-conductive state. Consequently, the voltage at the drain of each PMOS transistor is held constant with no oscillation.

The gate voltage of each NMOS transistor becomes Vth or higher when the control voltage is Vth or higher, which brings each NMOS transistor into the conductive state. Consequently, current is allowed to flow from the drain to source of each NMOS transistor. Since the NMOS may be considered as a resistance component, the voltage at the drain of the PMOS of each of the delay circuits varies with the current flowing in the NMOS connected to the PMOS.

In the delay circuit 10, e.g., the total amount of flowing current is constant, since the sources of the PMOS 12 and PMOS 13 are both connected to the current source 11. Accordingly, if current is allowed to flow in the PMOS 12 to increase the voltage at the drain thereof, current does not flow in the PMOS 13 and the voltage at the drain thereof does not increase. Conversely, if current is allowed to flow in the PMOS 13 to increase the voltage at the drain thereof, current does not flow in the PMOS 12 and the voltage at the drain thereof does not increase. In short, the voltages at the respective drains of the PMOS 12 and PMOS 13 move in opposite directions in level. The same shall apply to the delay circuits 20 and 30.

It is assumed here that current has flown in the PMOS 12 and the voltage at the drain thereof has increased. Since the voltage at the drain of the PMOS 12 is applied to the gate of the PMOS 22 in the delay circuit 20, the gate voltage of the PMOS 22 surpasses the threshold voltage, which brings the PMOS 22 into the non-conductive state with the current flow interrupted. Consequently, the voltage at the drain of the PMOS 22 decreases.

Since the voltage at the drain of the PMOS 22 is applied to the gate of the PMOS 32 in the delay circuit 30, the gate voltage of the PMOS 32 becomes lower than the threshold voltage, which brings the PMOS 32 into the conductive state with the current flow permitted. Consequently, the voltage at the drain of the PMOS 32 is increased.

Since the voltage at the drain of the PMOS 32 is applied to the gate of the PMOS 12 in the delay circuit 10, the gate voltage of the PMOS 12 surpasses the threshold voltage, which brings the PMOS 12 into the non-conductive state with the current flow interrupted. Consequently, the voltage at the drain of the PMOS 12 decreases.

Thus, the voltage at the drain of the PMOS 12 repeatedly increases and decreases with a given cycle, resulting in oscillation. The voltages at the respective drains of the PMOS 22 and PMOS 32 also oscillate in a similar manner.

In addition, the PMOS 13 in the delay circuit 10, the PMOS 23 in the delay circuit 20, and PMOS 33 in the delay circuit 30 also operate in a similar manner, so that the voltages at the respective drains thereof also oscillate in a similar manner.

As described above, since the voltages at the respective drains of the PMOS 12 and PMOS 13 in the delay circuit 10 move in opposite directions in level, they consequently oscillate with a 180°0 phase shift maintained therebetween. Likewise, the voltages at the respective drains of the PMOS 22 and PMOS 23 in the delay circuit 20 also oscillate with a 180° phase shift maintained therebetween, while the voltages at the respective drains of the PMOS 32 and PMOS 33 in the delay circuit 30 oscillate with a 180° phase shift maintained therebetween.

Figure 4:
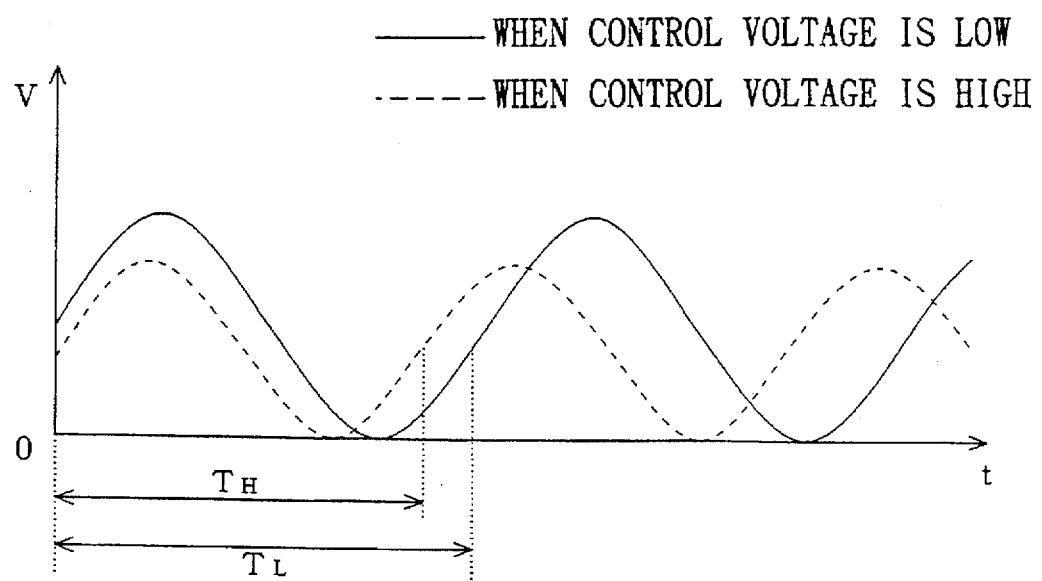
FIG. 4 is a view showing different waveforms of the output signal from each of the delay circuits when different control voltages are applied to the voltage-controlled oscillator according to the first embodiment of the present invention.

FIG. 4 shows different waveforms of the output signal from each of the delay circuits when different control voltages are applied. In the drawing, the solid line represents the waveform obtained when the control voltage is low and the broken line represents the waveform obtained when the control voltage is high. As can be understood from the drawing, the frequency of oscillation becomes high and the signal period becomes short when the control voltage is high, while the amplitude of the signal is reduced.

The voltage-controlled oscillator according to the present embodiment is characterized by the provision of the current source and differential delay circuits, which prevents adverse effects of variations in power-source voltage. The variations in power-source voltage can be subdivided into ac-like variations (such as high-frequency noise) and dc-like variations (such as instantaneous changes in voltage). As for the ac-like variations, the provision of the current source can prevent them from adversely affecting the frequency of oscillation.

As for the dc-like variations, the provision of the current source and differential delay circuits can prevent them from affecting the frequency of oscillation. In the case where a current source is with a normal MOS inverter, e.g., current is allowed to flow only when the MOS transistor is ON so that, if the power-source voltage changes instantaneously, the potential at a terminal of the MOS inverter connected to the current source becomes unstable and the frequency of oscillation becomes variable. On the other hand, in the case where a current source is used with a differential inverter, current is constantly allowed to flow so that the potential at a terminal connected to the current source remains stable. As a result, even if the power-source voltage changes instantaneously, the frequency of oscillation does not vary.

FIGS. 5 show examples of the input/output waveforms of the differential amplifier 50 in the voltage-controlled oscillator shown in FIG. 2, of which FIG. 5(a) shows the waveform at the + input of the differential amplifier 50 (the voltage at the drain of the PMOS 32 in the delay circuit 30), FIG. 5(b) shows the waveform at the − input of the differential amplifier 50 (the voltage at the drain of the PMOS 33 in the delay circuit 30), and FIG. 5(c) shows the waveform of the clock signal outputted from the differential amplifier 50.

As shown in FIG. 5, the differential amplifier 50 receives two oscillating signals having a period T and an amplitude V with a 180° phase shift maintained therebetween. The differential amplifier 50 outputs the clock signal having a period T, an amplitude VDD, and a constant duty ratio of 50%.

Figure 6A:
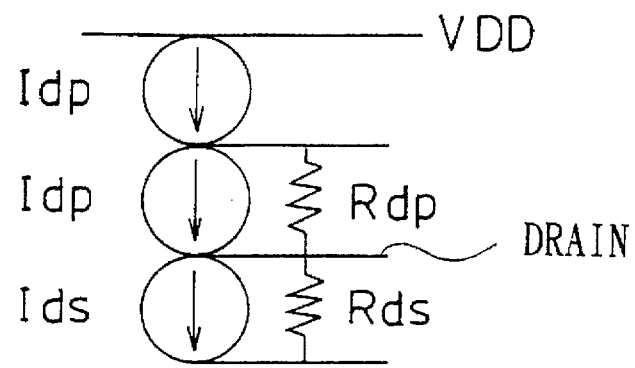
Figure 6B:

FIGS. 6 are views diagrammatically showing the operations of the respective delay circuits, of which FIG. 6(a) shows the case where the gate voltage of the PMOS is lower than the threshold voltage and the PMOS is in the conductive state. In the drawing, Idp represents the value of current flowing in the current source, Ids represents the value of current flowing from the drain to source of the NMOS, Rdp represents the value of internal resistance of the PMOS in the conductive state, and Rds represents the value of internal resistance of the NMOS. On the other hand; FIG. 6(b) shows the case where the gate voltage of the PMOS is higher than the threshold voltage and the PMOS is in the non-conductive state, in which I'ds represents the value of current flowing from the drain to source of the NMOS.

If the period of an oscillating signal is represented by T, the following equation is satisfied:

$$T/2 = CV/(Idp - Ids)$$

where C is an output capacitance of the delay circuit and V is the amplitude of the oscillating signal. Hence, $$V = VDD \times Rds/(Rdp + Rds)$$

is obtained.

Figure 6C:
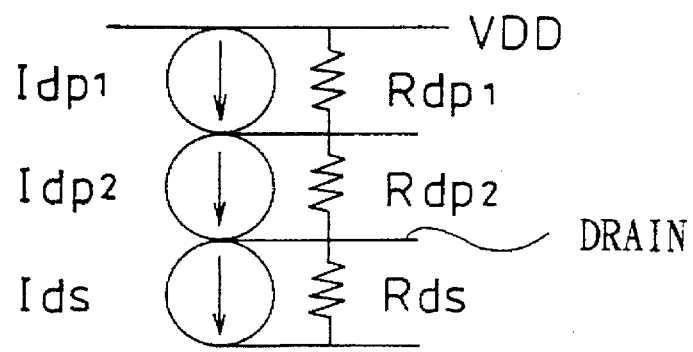

If the length of the channel is short in an NMOS, the gate voltage is substantially proportioned to the value of drain-to-source current due to the short channel effect. Consequently, (Idp−Ids) is directly proportioned to the control voltage, which ensures a linear relationship between the control voltage and the frequency of oscillation. FIG. 6(c) diagrammatically shows the case where the current source has internal resistance Rdp1. In the waveforms shown in FIGS. 5(a) and 5(b), a difference between the VDD potential and the source potential can be attributed to a voltage drop due to the internal resistance Rdp1 of the current source.

In the voltage-controlled oscillator shown in FIG. 2, the substrate and source of each of the PMOS transistors may be connected to a respective current source. Alternatively, the substrates and sources of all the PMOS transistors may be connected in common to a single current source.

Although FIG. 2 shows the case where three delay circuits are used, it is possible to constitute a voltage-controlled oscillator having a similar characteristic with the use of an odd number of delay circuits more than three.

It is also possible to constitute a voltage-controlled oscillator having a similar characteristic with the use of an even number of delay circuits.

Figure 7:
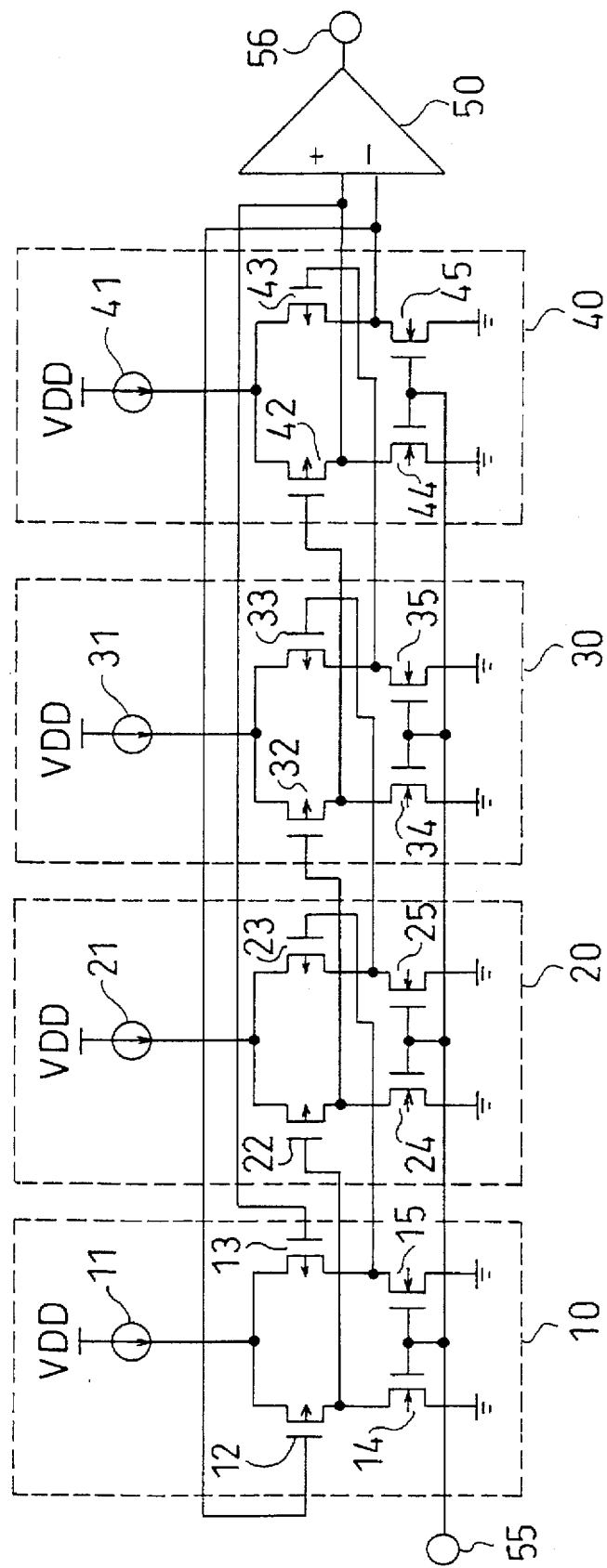
FIG. 7 is a view showing another arrangement of the voltage-controlled oscillator according to the first embodiment of the present invention.

FIG. 7 is a circuit diagram showing another arrangement of the voltage-controlled oscillator according to the first embodiment of the present invention, which is different from the voltage-controlled oscillator shown in FIG. 2 in that four delay circuits, instead of three delay circuits, are used therein. In FIG. 7 are shown: delay circuits 10, 20, 30, and 40; a differential amplifier 50; a control-voltage input terminal 55; and a clock-signal output terminal 56. The delay circuits 10, 20, and 30 are constituted similarly to those shown in FIG. 2. The delay circuit 40 also consists of a current source 41, a PMOS 42, a PMOS 43, an NMOS 44, and an NMOS 45, similarly to the other delay circuits.

The voltage at the drain of the PMOS 32 of the delay circuit 30 is applied to the gate of the PMOS 42 of the delay circuit 40, while the voltage at the drain of the PMOS 42 is applied to the gate of the PMOS 13 of the delay circuit 10. Likewise, the voltage at the drain of the PMOS 33 of the delay circuit 30 is applied to the gate of the PMOS 43 of the delay circuit 40, while the voltage at the drain of the PMOS 43 is applied to the gate of the PMOS 12 of the delay circuit 10.

It is assumed here that current has flown in the PMOS 12 of the delay circuit 10 and the voltage at the drain thereof has increased. Since the voltage at the drain of the PMOS 12 is applied to the gate of the PMOS 22 of the delay circuit 20, the gate voltage of the PMOS 22 surpasses the threshold voltage, which brings the PMOS 22 into the non-conductive state with the current flow interrupted. Consequently, the voltage at the drain of the PMOS 22 decreases.

Since the voltage at the drain of the PMOS 22 is applied to the gate of the PMOS 32 of the delay circuit 30, the gate voltage of the PMOS 32 becomes lower than the threshold voltage, which brings the PMOS 32 into the conductive state with the current flow permitted. Consequently, the voltage at the drain of the PMOS 32 increases. Since the voltage at the drain of the PMOS 32 is applied to the gate of the PMOS 42 of the delay circuit 40, the gate voltage of the PMOS 42 surpasses the threshold voltage, which brings the PMOS 42 into the non-conductive state with the current flow interrupted. Consequently, the voltage at the drain of the PMOS 42 decreases.

Since the voltage at the drain of the PMOS 42 is applied to the gate of the PMOS 13 of the delay circuit 10, the gate voltage of the PMOS 13 becomes lower than the threshold voltage, which brings the PMOS 13 into the conductive state with the current flow permitted. Consequently, the voltage at the drain of the PMOS 13 increases and the voltage at the drain of the PMOS 12 decreases.

Thus, the voltage at the drain of the PMOS 12 repeatedly increases and decreases with a given cycle, resulting in oscillation.

Although FIG. 7 shows the case where four delay circuits are used, it is possible to constitute a voltage-controlled oscillator having a similar characteristic with the use of an even number of delay circuits more than two.

Since the present embodiment uses a differential inverting circuit having a common-mode-input suppression ratio ten or more times as high as that of a single transistor such as an inverter to compose the delay circuit, the inverting operation can be performed at high speed, which enables high-frequency operation. It is possible to output an oscillating signal exhibiting a stable waveform with low jitter with respect to the current source with digital noise superimposed thereon.

Since inversion is accomplished with a negative-feedback circulating loop consisting of a differential amplifier and a large number of gates, the speed of inversion can be controlled with the delay circuits, so that the frequency of oscillation can be controlled. It will be appreciated that, if the combination of the differential amplifier and the circulating loop implements negative feedback, a similar characteristic is obtained.

Although the present embodiment has used NMOS transistors to constitute the first and second control elements, the present invention is not limited to the arrangement provided that each of the first and second control elements exhibits a linear current characteristic with respect to the applied control voltage.

(Second Embodiment)

Figure 8:
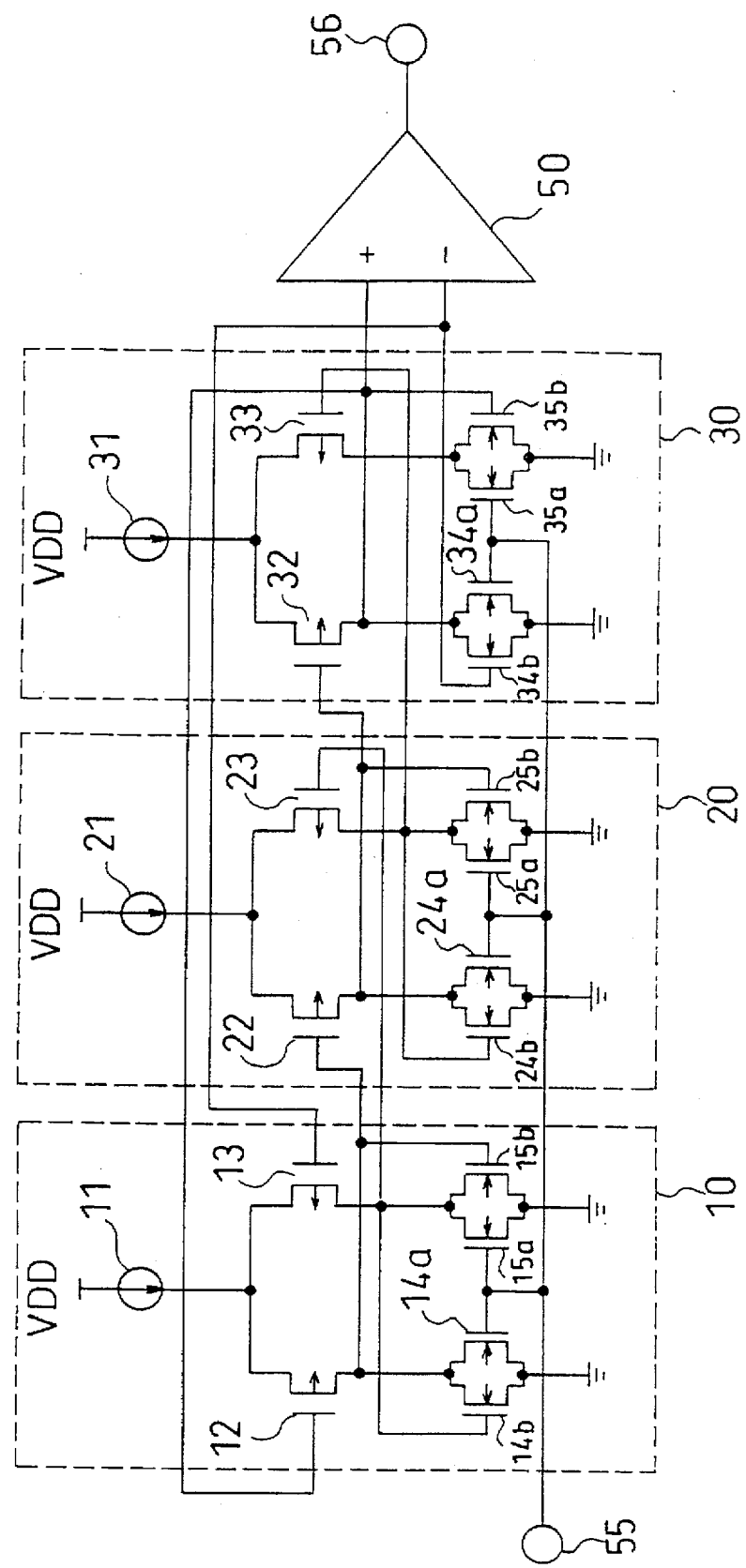
FIG. 8 is a view showing an arrangement of a voltage-controlled oscillator according to a second embodiment of the present invention.

FIG. 8 is a circuit diagram showing an arrangement of a voltage-controlled oscillator according to a second embodiment of the present invention, in which are shown: delay circuits 10, 20, and 30; a differential amplifier 50; a control-voltage input terminal 55; and a clock-signal output terminal 56. The arrangement of the voltage-controlled oscillator of the present embodiment is similar to that of the voltage-controlled oscillator shown in FIG. 2, except that the delay circuits have different internal structures.

The delay circuit 10 comprises, for example, an NMOS 14a instead of the NMOS 14 as the first control element and an NMOS 14b as a first latch element, while comprising an NMOS 15a instead of the NMOS 15 as the second control element and an NMOS 15b as a second latch element. The drains of the NMOS 14a and NMOS 14b are connected to the drain of the PMOS 12, while the drains of the NMOS 15a and NMOS 15b are connected to the drain of the PMOS 13. The control voltage is applied to the gates of the NMOS 14a and NMOS 15a. The voltage at the drain of the PMOS 13 is applied to the gate of the NMOS 14b. The voltage at the drain of the PMOS 12 is applied to the gate of the NMOS 15b.

The delay circuit 20 also comprises an NMOS 24a instead of the NMOS 24 as the first control element and an NMOS 24b as the first latch element, while comprising an NMOS 25a instead of the NMOS 25 as the second control element and an NMOS 25b as the second latch element. The delay circuit 30 also comprises an NMOS 34a instead of the NMOS 34 as the first control element and an NMOS 34b as the first latch element, while comprising an NMOS 35a instead of the NMOS 35 as the second control element and an NMOS 35b as the second latch element.

A description will be given to the operation of the voltage-controlled oscillator shown in FIG. 8.

If the threshold voltage of each of the NMOS transistors constituting the delay circuits is represented by Vth, the gate voltages of the NMOS transistors 14a, 15a, 24a, 25a, 34a, and 35a become equal to or lower than Vth, which brings them into the non-conductive state.

In this case, if the PMOS 12 is brought into the conductive state and the voltage at the drain thereof increases, the PMOS 22 is brought into the non-conductive state and the voltage at the drain thereof decreases. As a result, the PMOS 32 is brought into the conductive state and the voltage at the drain thereof increases, while the PMOS 12 is brought into the non-conductive state. Hence, current does not flow any more in the PMOS 12. If the voltage at the drain of the PMOS 12 increases, the gate voltage of the NMOS 15b increases, which brings the NMOS 15b into the conductive state. Hence, current starts flowing in the PMOS 13. Accordingly, the voltage at the drain of the PMOS 12 decreases, while the voltage at the drain of the PMOS 13 increases.

If the voltage at the drain of the PMOS 13 increases, the PMOS 23 is brought into the non-conductive state and the voltage at the drain thereof decreases, so that the PMOS 33 is brought into the conductive state and the voltage at the drain thereof increases, while the PMOS 13 is brought into the non-conductive state. Hence, current does not flow any more in the PMOS 13. If the voltage at the drain of the PMOS 13 increases, the gate voltage of the NMOS 14b increases, which brings the NMOS 14b into the conductive state. Hence, current starts flowing in the PMOS 12. Accordingly, the voltage at the drain of the PMOS 12 decreases, while the voltage at the drain of the PMOS 13 increases.

Thus, the voltage at each of the drains of the PMOS 12 and PMOS 13 repeatedly increases and decreases with a given cycle, resulting in oscillation. On the other hand, the frequency of oscillation remains constant irrespective of the value of the control voltage.

When the control voltage is equal to or higher than Vth, the gate voltages of the NMOS transistors 14a, 15a, 24a, 25a, 34a, and 35a also become equal to or higher than Vth, which brings them into the conductive state. In this case also, oscillation occurs.

Since the voltages at the drains of the PMOS 12 and PMOS 13 of the delay circuit 10 move in opposite directions in level, oscillation occurs with a 180° phase shift maintained therebetween. Likewise, the voltages at the drains of the PMOS 22 and PMOS 23 of the delay circuit 20 also oscillate with a 180° phase difference, while the voltages at the drains of the PMOS 32 and PMOS 33 of the delay circuit 30 oscillate with a 180° phase difference. Consequently, the signal waveforms as shown in FIG. 5 are obtained, while the differential amplifier 50 outputs the clock signal having a constant duty ratio of 50%.

The voltage-controlled oscillator according to the present embodiment is characterized by the provision of the latch element in each of the delay circuits.

In the case of using the voltage-controlled oscillator according to the first embodiment, positive feedback occurs when the control voltage surpasses a give value, which halts the oscillation. In the case of using the voltage-controlled oscillator according to the present embodiment, the oscillation is maintained by the operation of the latch elements even when the control voltage has such a value as to halt the oscillation in the voltage-controlled oscillator according to the first embodiment.

Figure 9:
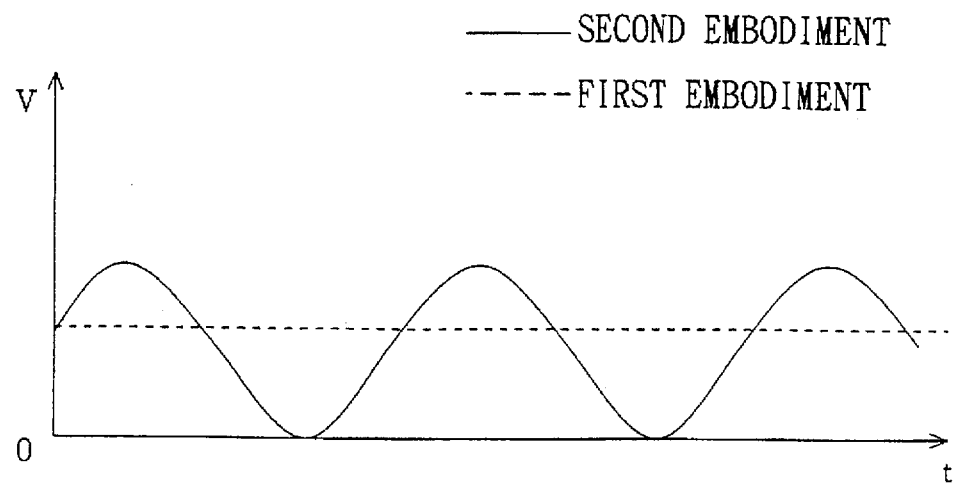
FIG. 9 is a view showing the respective output signals from the voltage-controlled oscillators according to the first and second embodiments when the control voltage is high.

FIG. 9 shows respective output signals from the voltage-controlled oscillators according to the first and second embodiments when the control voltage is high, which are indicated by the solid line and by the broken line, respectively. As shown in FIG. 9, the oscillation is maintained in the second embodiment even when the control voltage has such a value as to halt the oscillation in the first embodiment.

It will be appreciated from the drawing that the use of the latch elements enables oscillation at a higher frequency when the current source has the same ability. Accordingly, the voltage-controlled oscillator according to the present embodiment can increase the maximum frequency of oscillation without increasing power consumption. Moreover, the power consumption required to cause oscillation at a specified frequency is reduced. If no latch element is used, the ability of the current source should be enhanced to increase the frequency of oscillation.

Figure 10A:
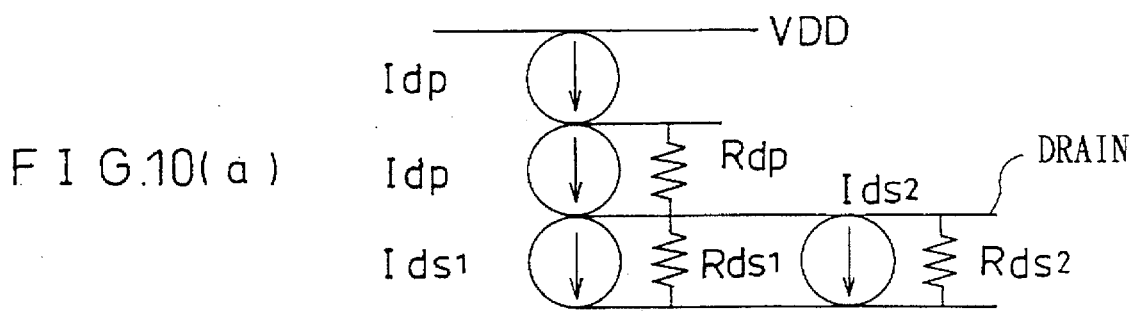
Figure 10B:
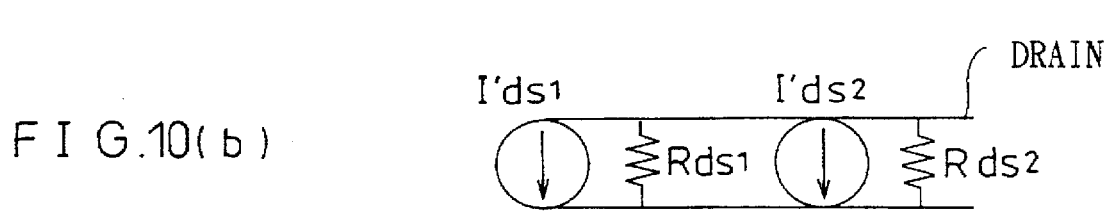

FIGS. 10 are views diagrammatically showing the operations of the respective delay circuits, of which FIG. 10(a) shows the case where the gate voltage of the PMOS is lower than the threshold voltage and the PMOS is in the conductive state. In the PMOS 12, NMOS 14a, and NMOS 14b, for example, Idp represents the value of current flowing in the current source, Ids1 represents the value of drain-to-source current in the NMOS 14a, Ids2 represents the value of drain-to-source current in the NMOS 14b, Rdp represents the value of internal resistance of the PMOS 12 in the conductive state, Rds1 represents the value of internal resistance of the NMOS 14a, and Rds2 represents the value of internal resistance of the NMOS 14b. On the other hand, FIG. 10(b) represents the case where the gate voltage of the PMOS is higher than the threshold voltage and the PMOS is in the non-conductive state. In the PMOS 12, NMOS 14a, and NMOS 14b, for example, I'ds1 represents the value of drain-to-source current in the NMOS 14a and I'ds2 represents the value of drain-to-source current in the NMOS 14b.

If the period of the oscillating signal is represented by T, the following equation is satisfied:

$$T/2 = CV/(Idp - Ids1 - Ids2)$$

where C is the output capacitance of a delay circuit and V is the amplitude of the oscillating signal.

When the length of the channel is short in an NMOS, the gate voltage is substantially proportional to the value of drain-to-source current due to the short channel effect. Consequently, (Idp−Ids1−Ids2) is directly proportioned to the control voltage, which ensures a linear relationship between the control voltage and the frequency of oscillation.

In the voltage-controlled oscillator shown in FIG. 8, the substrate and source of each of the PMOS transistors may be connected to a respective current source. Alternatively, the substrates and sources of all the PMOS transistors may be connected in common to a single current source.

Since the present embodiment uses a differential circuit having a common-mode-input suppression ratio ten or more times as high as that of a single transistor such as an inverter to compose the delay circuit, the inverting operation is performed at high speed, which enables high-frequency operation. It is possible to output an oscillating signal exhibiting a stable waveform with low jitter with respect to the current source with digital noise superimposed thereon. Since inversion is accomplished with a negative-feedback circulating loop consisting of a differential amplifier and a large number of gates, the speed of inversion can be controlled with delay circuits, so that the frequency of oscillation can be controlled.

Moreover, since the delay circuit has the latch element, the output voltage from the delay circuit presents a large amplitude. Consequently, stable operation can be performed with a lower voltage than in the circuit shown in the first embodiment.

Although the first and second latch elements are composed of the NMOS transistors in the present embodiment, the present invention is not limited to the arrangement. The first or second latch element may also be composed of any element provided that the resistance value varies with source-to-drain current in the first or second FET.

Although the first and second FETs are composed of the PMOS transistors in the first and second embodiments, similar effects can be achieved even when they are composed of NMOS transistors. In this case, it is sufficient to use, e.g., PMOS transistors receiving the control voltage applied to the gates thereof to compose the first and second control elements. Alternatively, it is sufficient to use PMOS transistors to compose the first and second latch elements.

(Third Embodiment)

To the voltage-controlled oscillators according to the first and second embodiments, the control voltage is directly inputted from the outside. A third embodiment of the present invention is associated with a limiter circuit for changing the control voltage supplied from the outside to an appropriate value before it is inputted to the voltage-controlled oscillator.

Figure 11:
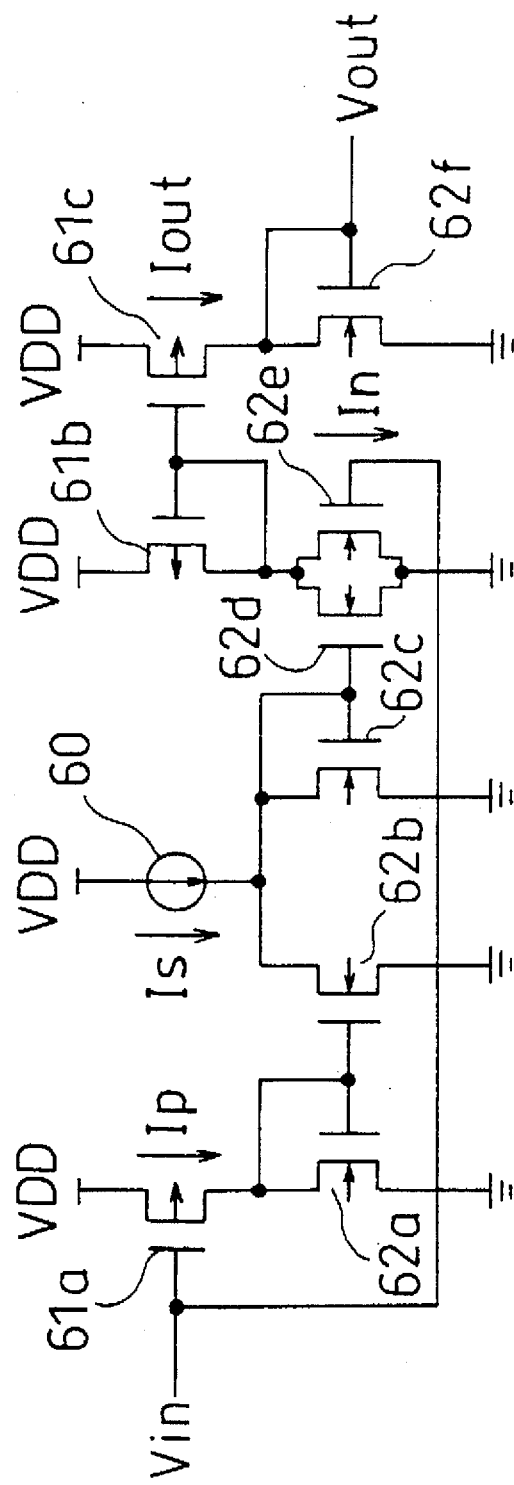
FIG. 11 shows an arrangement of a limiter circuit according to a third embodiment of the present invention.

FIG. 11 is a circuit diagram showing an arrangement of the limiter circuit according to the third embodiment of the present invention, in which are shown: a current source 60; PMOS transistors 61a, 61b, and 61c; NMOS transistors 62a, 62b, 62c, 62d, 62e, and 62f; a control voltage Vin inputted from the outside; and a control voltage Vout outputted to the outside.

The inputted control voltage Vin is applied to the gates of the PMOS 61a and NMOS 62e. It is assumed here that a current from the current source 60 is represented by Is, the threshold voltage of the PMOS 61a is Vpth, source-to-drain current in the PMOS 61a is Ip, the threshold voltage of the NMOS 62e is Vnth, drain-to-source current in the NMOS 62e is In, and source-to-drain current in the PMOS 61c is Iout.

Figure 12:
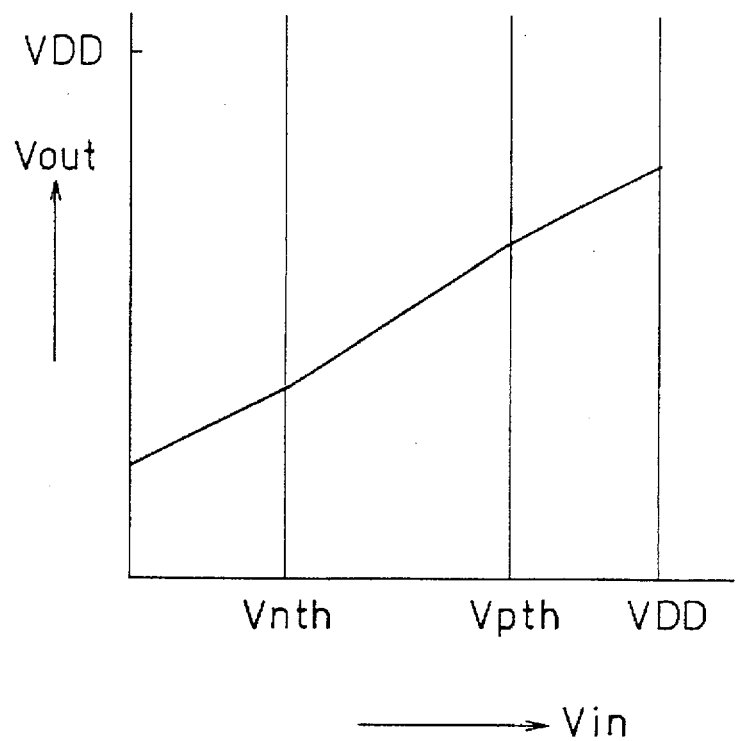
FIG. 12 is a graph showing a relationship between an input voltage and an output voltage in the limiter circuit shown in FIG. 11.

When Vin≦Vnth is satisfied, the drain-to-source current in the NMOS 62e is interrupted and hence $$Iout = Is - Ip$$

is obtained. When Vnth≦Vin≦Vpth are satisfied, $$Iout = Is - Ip + In$$

is obtained. When Vin≧Vpth is satisfied, the source-to-drain current in the PMOS 61a is interrupted and $$Iout = In$$

is obtained. If Vin≦Vpth is satisfied, Vin is directly proportioned to −Ip. On the other hand, if Vin≧Vnth is satisfied, Vin is directly proportioned to In. Since Vout is substantially proportional to Iout, the relationship as shown in FIG. 12 is provided between Vin and Vout. That is, when the inputted control voltage Vin changes, the outputted control voltage Vout changes substantially linearly. Moreover, since the voltage gain is small, Vout does not reach the power-source voltage and remains unsaturated even when Vin reaches the power-source voltage.

In the limiter circuit shown in FIG. 11, however, the current value Ip in the PMOS 61a changes with a change in power-source voltage VDD even when the inputted control voltage Vin is constant, resulting a change in the outputted control voltage Vout.

Figure 13:
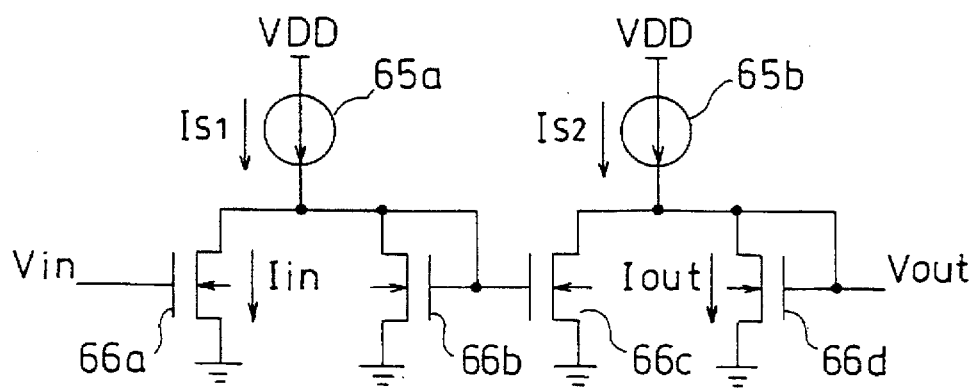
FIG. 13 is a view showing another arrangement of the limiter circuit according to the third embodiment of the present invention.

FIG. 13 is a circuit diagram showing another arrangement of the limiter circuit according to the third embodiment of the present invention, in which are shown: current sources 65a and 65b; NMOS transistors 66a, 66b, 66c, and 66d; the control voltage Vin inputted from the outside; and the control voltage Vout outputted to the outside.

The inputted control voltage Vin is applied to the gate of the NMOS 66a. It is assumed here that current from the current source 65a is represented by Is1, current from the current source 65b is Is2, drain-to-source current in the NMOS 66a is Iin, the threshold voltage of the NMOS 66a is Vnth; and drain-to-source current in the NMOS 66d is Iout.

In this case, $$Iout = Is2 - Is1 + Iin$$

is satisfied and hence the following equations are obtained:

$$\begin{aligned} Vout &= A \times Iout + Vpth \\ &= A \times (Is2 - Is1 + Iin) + Vpth \end{aligned}$$

where A is a constant determined by the physical properties of the NMOS 66d and Vpth is the threshold voltage of the NMOS 66d.

If Vin≦Vnth is satisfied, current in the NMOS 66a is interrupted, so that Iin=0 is obtained. On the other hand, if Vin≧Vnth is satisfied, Vin is directly proportioned to Iin.

Figure 14:
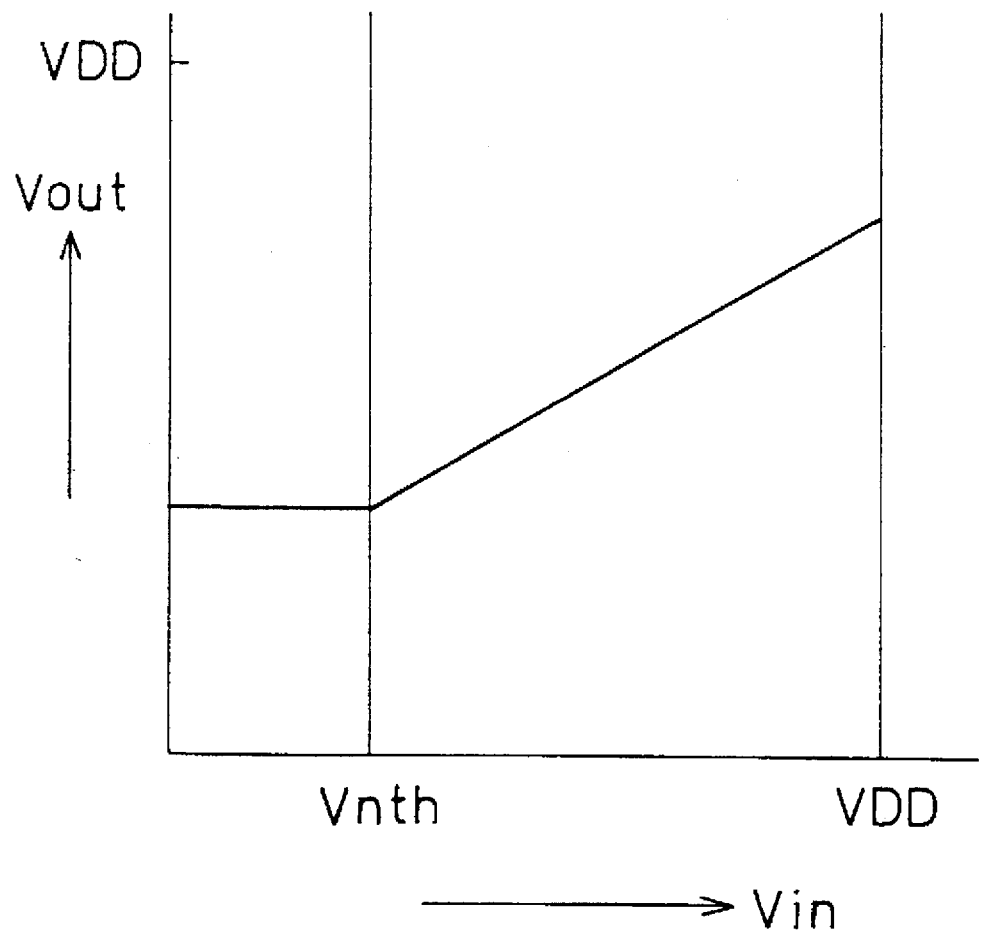
FIG. 14 is a graph showing a relationship between an input voltage and an output voltage in the limiter circuit shown in FIG. 13.

Consequently, the relationship as shown in FIG. 14 is provided between Vin and Vout. That is, if the inputted control voltage Vin changes, the control voltage Vout outputted when Vin≧Vnth also changes linearly. Moreover, since the voltage gain is small, Vout does not reach the power-source voltage and remains unsaturated even when Vin reaches the power-source voltage.

In the limiter circuit shown in FIG. 13, only the NMOS 66a receives the inputted control voltage Vin, so that the outputted control voltage Vout does not change even when the power-source voltage VDD changes, provided that Vin is constant.

Thus, with the limiter circuit according to the present embodiment, the voltage-controlled oscillator obtains the optimum frequency characteristic. By using the limiter circuit shown in FIG. 13, in particular, the voltage-controlled oscillator obtains a frequency characteristic exhibiting linearity with respect to the control voltage, while it becomes immune to the influence of variations in power-source voltage.

I claim:

1. A voltage-controlled oscillator for outputting an oscillating signal at a frequency corresponding to a control voltage applied thereto, comprising
a plurality of delay circuits connected in a ring configuration and each providing a delay time varying with the applied control voltage, wherein
each of said delay circuits comprises:
a current source; and
a differential pair of first and second inverting circuits each supplied with current from said current source, wherein said first inverting circuit comprises:
a first FET supplied with the current from said current source to a source thereof;
a first control element connected to a drain of said first FET to receive said control voltage applied thereto, said first control element having a linear current characteristic to the applied control voltage; and
a first latch element connected in parallel to said first control element, said first latch element having a small resistance value when source-to-drain current flowing in said second FET is large and having a large resistance value when the source-to-drain current flowing in said second FET is small, and
said second inverting circuit comprises:
a second FET supplied with the current from said current source to a source thereof;
a second control element connected to a drain of said second FET to receive said control voltage applied thereto, said second control element having a linear current characteristic to the applied control voltage, wherein
an input signal to each of the delay circuits is inputted to respective gates of said first and second FETs and an output signal from each of the delay circuits is outputted from the respective drains of said first and second FETS; and
a second latch element connected in parallel to said second control element, said second latch element having a small resistance value when source-to-drain current flowing in said first FET is large and having a large resistance value when the source-to-drain current flowing in said first FET is small,
said first and second FETs are P-type or N-type FETs, and
said first and second control elements are N-type or P-type FETs receiving said control voltage applied to respective gates thereof.

2. A voltage-controlled oscillator according to claim 1, wherein
said first and second FETs are P-type FETs,
said first and second control elements are N-type FETs receiving said control voltage applied to respective gates thereof,
said first latch element is an N-type FET receiving a voltage at the drain of said second FET applied to a gate thereof, and
said second latch element is an N-type FET receiving a voltage at the drain of said first FET applied to a gate thereof.

3. A voltage-controlled oscillator according to claim 1, wherein
said first and second FETs are N-type FETS,
said first and second control elements are P-type FETs receiving said control voltage applied to respective gates thereof,
said first latch element is a P-type FET receiving a voltage at the drain of said second FET applied to a gate thereof, and
said second latch element is a P-type FET receiving a voltage at the drain of said first FET to a gate thereof.

4. A PLL circuit comprising a voltage-controlled oscillator outputting an oscillating signal at a frequency corresponding to a control voltage applied thereto, wherein
said voltage-controlled oscillator comprises
a plurality of delay circuits connected in a ring configuration and each providing a delay time varying with the applied control voltage,
each of said delay circuits comprising:
a current source;
a differential pair of first and second inverting circuits each supplied with current from said current source; and
a limiter circuit for changing the supplied control voltage to a value at which said voltage-controlled oscillator can operate properly, while maintaining a linear characteristic to the supplied control voltage, and outputting the changed voltage to said voltage-controlled oscillator, wherein
said limiter circuit comprises:
a first current source;
a first FET receiving supplied with current from said first current source to a source thereof;

a second FET supplied with the current from said first current source to a source thereof, the source of said second FET being connected to a gate thereof;

a second current source;

a third FET supplied with current from said second current source to a source thereof, a gate of said third FET being connected to the gate of said second FET; and a fourth FET supplied with the current from said second current source to a source thereof, the source of said fourth FET being connected to a gate thereof, said limiter circuit receiving said control voltage supplied to a gate of said first FET and outputting a gate voltage of said fourth FET to said voltage-controlled oscillator.

* * * * *